United States Patent
Yeo et al.

(10) Patent No.: US 10,151,973 B2
(45) Date of Patent: Dec. 11, 2018

(54) IMPRINT LITHOGRAPHY METHOD, METHOD FOR MANUFACTURING MASTER TEMPLATE USING THE METHOD AND MASTER TEMPLATE MANUFACTURED BY THE METHOD

(71) Applicant: Samsung Display Co., Ltd., Yongin-si (KR)

(72) Inventors: Yun-Jong Yeo, Seoul (KR); Jung-Ha Son, Seoul (KR); Joo-Hyung Lee, Seongnam-si (KR); Dae-Young Lee, Seoul (KR)

(73) Assignee: Samsung Display Co., Ltd, Yongin-si (KR)

( * ) Notice: Subject to any disclaimer, the term of this patent is extended or adjusted under 35 U.S.C. 154(b) by 336 days.

(21) Appl. No.: 14/886,673

(22) Filed: Oct. 19, 2015

(65) Prior Publication Data

US 2016/0299423 A1     Oct. 13, 2016

(30) Foreign Application Priority Data

Apr. 10, 2015   (KR) .................. 10-2015-0050974

(51) Int. Cl.
*G03F 7/20*     (2006.01)
*G03F 7/00*     (2006.01)

(52) U.S. Cl.
CPC .................. *G03F 7/0002* (2013.01)

(58) Field of Classification Search
CPC .................. G03F 7/0002; G03F 7/0035
See application file for complete search history.

(56) References Cited

U.S. PATENT DOCUMENTS

| | | |
|---|---|---|
| 6,221,542 B1 | 4/2001 | Reinberg |
| 8,236,464 B1 | 8/2012 | Shih |
| 8,703,406 B2 | 4/2014 | Schaper |
| 2007/0087290 A1* | 4/2007 | Sandhu ............... G03F 7/70383 430/311 |
| 2007/0264591 A1* | 11/2007 | Wuister ............... B82Y 10/00 430/269 |
| 2009/0189306 A1* | 7/2009 | Terasaki ............... B82Y 10/00 264/238 |
| 2012/0074097 A1* | 3/2012 | Lee ....................... C30B 25/186 216/48 |
| 2013/0153534 A1 | 6/2013 | Resnick et al. |

(Continued)

*Primary Examiner* — Galen H Hauth
(74) *Attorney, Agent, or Firm* — H.C. Park & Associates, PLC

(57) ABSTRACT

An imprint lithography method includes disposing a mask layer on a base substrate in first and in second areas, reducing a thickness of the mask layer in the first area, disposing a first planarization layer on the mask layer in the first and second areas, forming a first imprint pattern on the first planarization layer, forming a first planarization layer pattern by etching the first planarization layer using the first imprint pattern, forming a first mask pattern in the first area by etching the mask layer using the first planarization layer pattern, diposing a second planarization layer on the first mask pattern and the mask layer in the first and second areas, forming a second imprint pattern on the second planarization layer, forming a second planarization layer pattern by etching the planarization layer using the second imprint pattern, and forming a second mask pattern in the second area.

19 Claims, 11 Drawing Sheets

(56) References Cited

U.S. PATENT DOCUMENTS

2014/0017614 A1* 1/2014 Schaper ............... G03F 7/0035
430/323
2014/0087016 A1 3/2014 Gao et al.

* cited by examiner

IMPRINT LITHOGRAPHY METHOD, METHOD FOR MANUFACTURING MASTER TEMPLATE USING THE METHOD AND MASTER TEMPLATE MANUFACTURED BY THE METHOD

CROSS-REFERENCE TO RELATED APPLICATION

This application claims priority from and the benefit of Korean Patent Application No. 10-2015-0050974, filed on Apr. 10, 2015, which is hereby incorporated by reference for all purposes as if fully set forth herein.

BACKGROUND

Field

Exemplary embodiments relate to an imprint lithography method, a manufacturing method for a master template using the imprint lithography method, and a master template for imprint lithography process manufactured by the manufacturing method. More particularly, exemplary embodiments relate to an imprint lithography method for a larger area process, a manufacturing method for a master template using the imprint lithography method, and a master template for imprint lithography process manufactured by the manufacturing method.

Discussion of the Background

Recently, display apparatuses having light weight and small size have been manufactured. A cathode ray tube (CRT) display apparatus has often been used in the past as a result of performance advantages and competitive pricing. However, the CRT display apparatus suffers from disadvantages in having a large size and lack of portability. Therefore, newer display apparatuses, such as a plasma display apparatus, a liquid crystal display apparatus, and an organic light emitting display apparatus, have been highly preferred by users due to their smaller sizes, lighter weights, and relatively low power consumption.

The liquid crystal display apparatus applies a voltage to a specific molecular arrangement configured to change the molecular arrangement. The liquid crystal display apparatus displays an image using changes in optical properties (for example, birefringence, rotatory polarization, dichroism, and light scattering) of a liquid crystal cell according to the changes in the molecular arrangement.

The liquid crystal display apparatus includes a polarizer to control arrangement of the liquid crystal molecules, a display panel, an optical sheet, and a backlight assembly. Recently, an in-call polarizer structure, in which a polarizer is disposed inside of the display panel, has been applied to the polarizer. For example, a wire grid polarizer may be used. The wire grid polarizer may be formed by an imprint lithography process. However, the size of a master template for the imprint lithography process is limited, so that it is hard to manufacture a large display panel.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an imprint lithography method for a large area process.

Exemplary embodiments also provide a manufacturing method for a master template using the imprint lithography method.

Exemplary embodiments also provide a master template for imprint lithography process manufactured by the manufacturing method.

Additional aspects will be set forth in the detailed description which follows, and, in part, will be apparent from the disclosure, or may be learned by practice of the inventive concept.

An exemplary embodiment discloses an imprint lithography method including: disposing a mask layer on a base substrate in a first area and in a second area, the second area being adjacent to the first area; reducing a thickness of the mask layer in the first area; disposing a first planarization layer on the mask layer in the first and second areas; forming a first imprint pattern on the first planarization layer; forming a first planarization layer pattern by etching the first planarization layer using the first imprint pattern as an etch barrier; forming a first mask pattern in the first area by etching the mask layer using the first planarization layer pattern as an etch barrier; disposing a second planarization layer on the first mask pattern and the mask layer in the first and second areas; forming a second imprint pattern on the second planarization layer; forming a second planarization layer pattern by etching the second planarization layer using the second imprint pattern as an etch barrier; and forming a second mask pattern in the second area by etching the mask layer using the second planarization layer pattern as an etch barrier.

An exemplary embodiment also discloses a method of manufacturing a master template for imprint lithography including: disposing a mask layer on a base substrate in a first area and in a second area, the second area being adjacent to the first area; reducing a thickness of the mask layer in the first area; forming a first imprint pattern on the mask layer in the first area and in a portion of the second area, the portion of the second area being closer to the first area than the remaining portion of the second area; forming a first mask pattern in the first area by etching the mask layer using the first imprint pattern as an etch barrier; forming a second imprint pattern on the mask layer in the second area and in a portion of the first area, the portion of the first area being closer to the second area than the remaining portion of the first area; forming a second mask pattern in the second area by etching the mask layer using the second imprint pattern as an etch barrier; and etching an object under the first and second mask patterns using the first and second mask patterns as etch barriers.

An exemplary embodiment also discloses a master template for imprint lithography including: a substrate having a diagonal length greater than 300 mm; and a wire grid pattern disposed on the substrate in a first area and a second area of the substrate, the second area being adjacent to the first area. An error of pitch of the wire grid pattern at a boundary between the first area and the second area is less than ½ pitch, and one pitch corresponds to a sum of a width of a wire line of the wire grid pattern and a width of an interval between two adjacent wire lines of the wire grid pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1A:
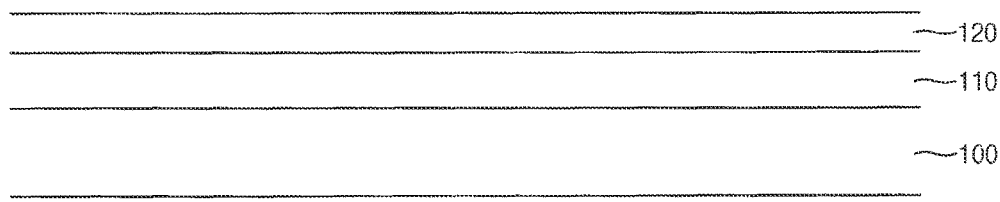
FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, and FIG. 1M are cross-sectional views illustrating an imprint lithography method according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, and FIG. 1M are cross-sectional views illustrating an imprint lithography method according to an exemplary embodiment.

Referring to FIG. 1A, a first layer 110 may be disposed on a base substrate 100. The base substrate 100 may include a material which has relatively high transmittance, thermal resistance, and/or chemical resistance. For example, the base substrate 100 may include a glass substrate, a quartz substrate, a transparent resin substrate, etc. Examples of the transparent resin substrate for the base substrate 100 may include polyimide-based resin, acryl-based resin, polyacrylate-based resin, polycarbonate-based resin, polyether-based resin, sulfonic acid containing resin, polyethyleneterephthalate-based resin, etc.

The first layer 110 may include a transparent material which passes ultraviolet rays. For example, the first layer 110 may include transparent silicon compound. For example, the first layer 110 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), etc. These materials may be used alone or in a mixture thereof. In addition, the first layer 110 may include aluminum (Al), titanium (Ti), copper (Cu), indium tin oxide (ITO), indium zinc oxide (IZO), etc. These materials may also be used alone or in a mixture thereof.

A mask layer 120 may be disposed on the first layer 110. The mask layer 120 may have etch selectivity with respect to the first layer 110. Thus, the mask layer 120 may include a material which has etch rates lower than etch rates of the first layer 110 in an etching condition of the first layer 110. For example, when the first layer 110 includes silicon oxide ($SiO_x$), the mask layer 120 may include a metal such as aluminum. When the first layer 110 includes aluminum, the mask layer 120 may include silicon oxide ($SiO_x$).

Figure 1B:
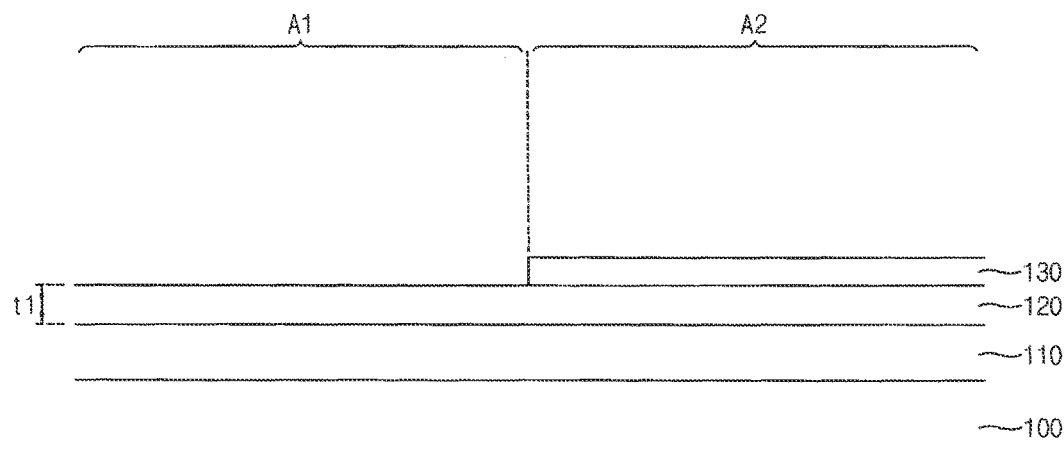

Referring to FIG. 1B, a first etch protection layer 130 may be disposed on the mask layer 120 in a second area A2 which is adjacent to a first area A1 in which the first etch protection layer 130 is not disposed. An etch protection layer may be referred to as an etch stop layer. The etch protection layer may protect or stop etching of a layer beneath the etch protection layer while other areas on which the etch protection layer is not disposed are etched. Thus, the etch protection layer may protects or stops etching when certain etching chemicals are applied. However, the etch protection layer may be etched when certain chemicals that can etch the etch protection layer are applied. The first etch protection layer 130 may have etch selectivity with respect to the mask layer 120. Thus, the first etch protection layer 130 may include a material which has etch rates lower than that of the mask layer 120 in an etching condition of the mask layer 120. For example, the first etch protection layer 130 may include a silicon compound, such as silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), etc.

Figure 1C:
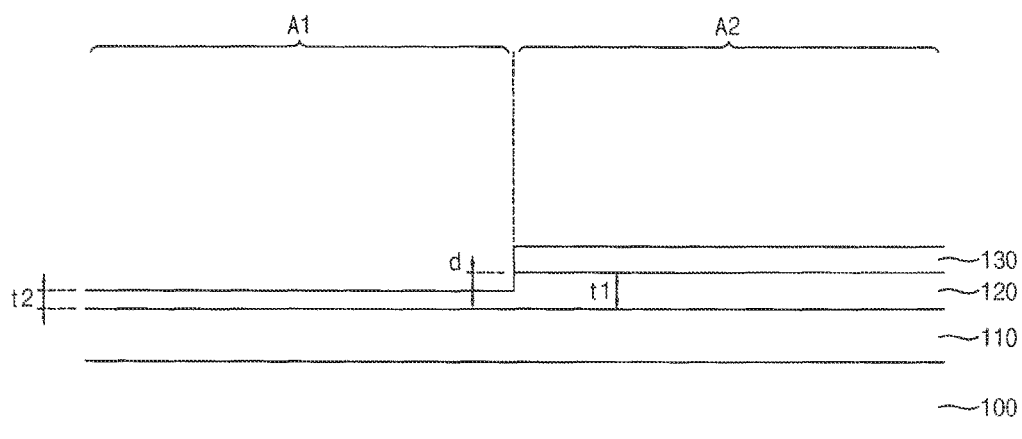

Referring to FIG. 1C, the mask layer 120 may be etched using the first etch protection layer 130. Accordingly, the mask layer 120 may have a second thickness t2 in the first area A1 where the first etch protection layer 130 is not disposed. The mask layer 120 may have a first thickness t1 in the second area A2 where the first etch protection layer 130 is disposed. The second thickness t2 may be less than the first thickness t1. A difference d of the first thickness t1 and the second thickness t2 may be determined in consideration of a thickness of a first planarization layer, which will be mentioned in FIG. 1J, a thickness of the mask layer 120, and etch selectivity of the mask layer 120 with respect to a first planarization layer 140 shown in FIG. 1D.

Figure 1D:
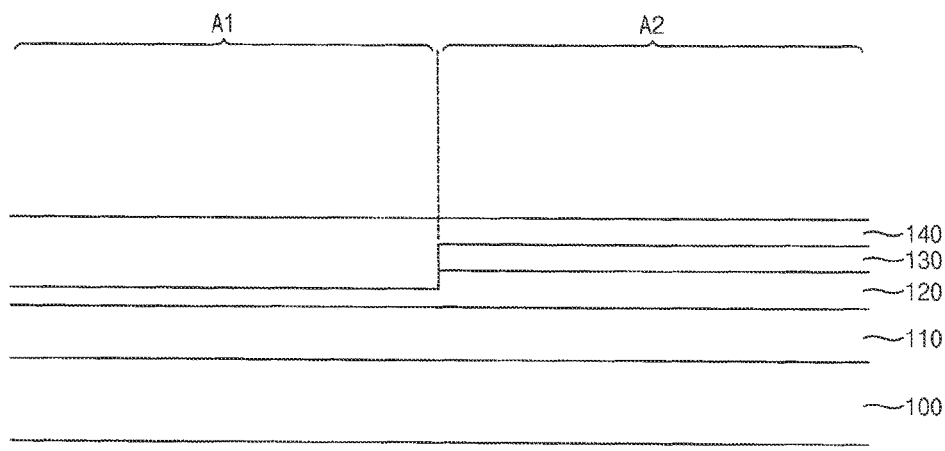

Referring to FIG. 1D, a first planarization layer 140 may be disposed on the first etch protection layer 130 and the mask layer 120 in the first and second areas A1 and A2. The first planarization layer 140 may be disposed on the first etch protection layer 130 and the mask layer 120 configured to planarize a stepped portion between the first area A1 and the second area A2, which is formed due to the mask layer 120 and the first etch protection layer 130.

The first planarization layer 140 may include an organic material. For example, the first planarization layer 140 may include photoresist, acrylic resin, polyimide resin, polyamide resin, siloxane-based resin, and etc. These materials may be used alone or in a mixture thereof.

An additional process to improve flatness of an upper surface of the first planarization layer 140 may be performed. For example, an etch back process or chemical mechanical polishing process to the entire upper surface of the first planarization layer 140 may be performed.

Figure 1E:
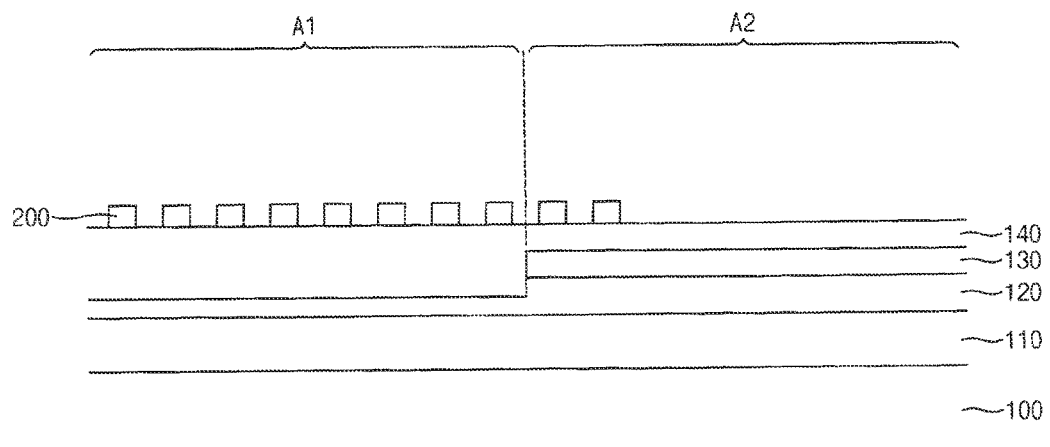

Referring to FIG. 1E, a first imprint pattern 200 may be formed on the first planarization layer 140. The first imprint pattern 200 may be disposed in the first area A1. In addition, the first imprint pattern 200 may be formed in the first area A1 and in a portion of the second area A2 near the first area A1 as shown in FIG. 1E.

The first imprint pattern 200 may have a shape corresponding to a wire grid pattern of a wire grid polarizer, such that the shape may be a plurality of protrusions having the same shape spaced apart from each other by a uniform interval on the first planarization layer 140. The protrusions may have pitch about 50 nm (nanometers) to 150 nm. The pitch may be defined as the sum of widths of one protrusion and a distance between two adjacent ones of the protrusions.

The first imprint pattern 200 may be formed by an imprint process.

For example, a resin solution may be disposed in the form of droplet on the first planarization layer 140 by an ink jet method. The resin solution may be an ultraviolet ray curable resin composition having a relatively low viscosity.

Then, as an imprint mold (not shown) is getting close to the base substrate 100, the resin solution may form a first preliminary pattern (not shown) by the imprint mold. The imprint mold may have a mirrored pattern to the first preliminary pattern. The first preliminary pattern may include a residual layer formed on the first planarization layer 140 and protrusions formed on the residual layer.

Then, ultraviolet rays may be radiated to the first preliminary pattern, so that resin solution of the first preliminary pattern may be hardened. The imprint mold may pass the ultraviolet rays, so that the ultraviolet rays may reach the first preliminary pattern through the imprint mold. Thus, the resin solution of the first preliminary pattern may be hardened.

Then, the first preliminary pattern may be overall etched to remove the residual layer between the protrusions, so that the first imprint pattern 200 may be formed.

Figure 1F:
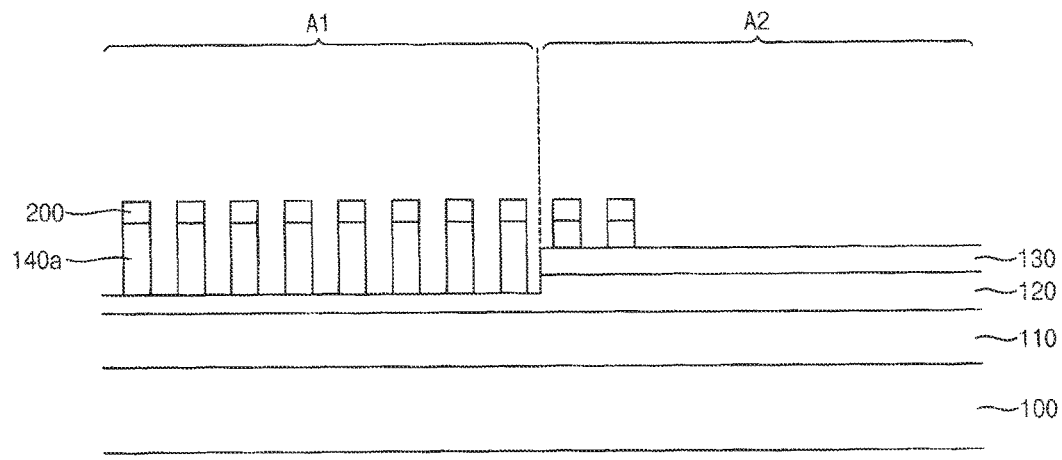

Referring to FIG. 1F, the first planarization layer 140 may be partially removed by using the first imprint pattern 200 as a mask. Accordingly, a first planarization layer pattern 140a may be formed in the first area A1. Further, the first planarization layer pattern 140a may be formed in the portion of the second area A2 near the first area A1 as shown in FIG. 1F.

For example, the first planarization layer 140 may be dry etched by using the first imprint pattern 200 as an etch barrier. Accordingly, the mask layer 120 in the first area A1 may be exposed. Here, the first etch protection layer 130 covers the second area A2, so that although the first planarization layer 140 in the second area A2 is removed and the first etch protection layer 130 is exposed, the mask layer 120 in the second area A2 may remain unetched. The first planarization layer 140 may have an etch selectivity with respect to the first etch protection layer 130.

Figure 1G:
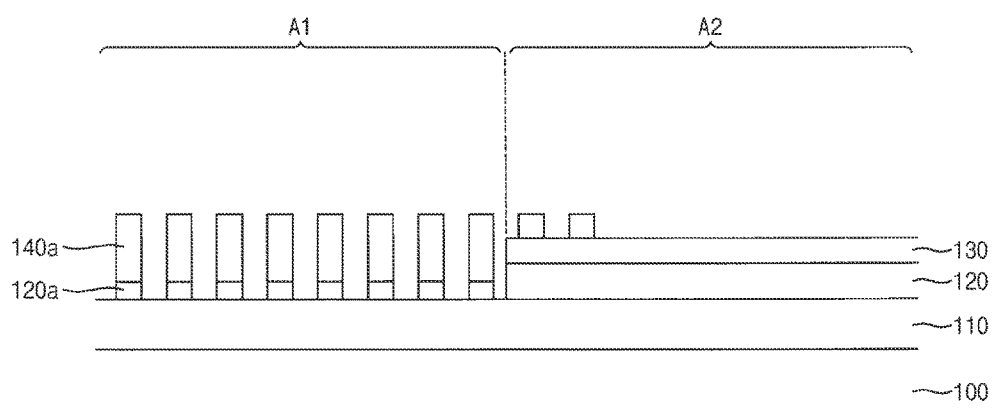

Referring to FIG. 1G, the mask layer 120 in the first area A1 may be partially removed by using the remaining portion of the first imprint pattern 200, the first planarization layer pattern 140a and the first etch protection layer 130 as a mask. Accordingly, a mask pattern 120a may be formed in the first area A1.

For example, the mask layer 120 in the first area A1 may be dry etched by using the remaining portion of the first imprint pattern 200, the first planarization layer pattern 140a, and the first etch protection layer 130 as an etch barrier. Accordingly, the first layer 110 in the first area A1 may be exposed. Here, the first etch protection layer 130 covers the second area A2, and the mask layer 120 in the second area A2 may remain unetched. The mask layer 120 may have an etch selectivity with respect to the first etch protection layer 130.

Figure 1H:
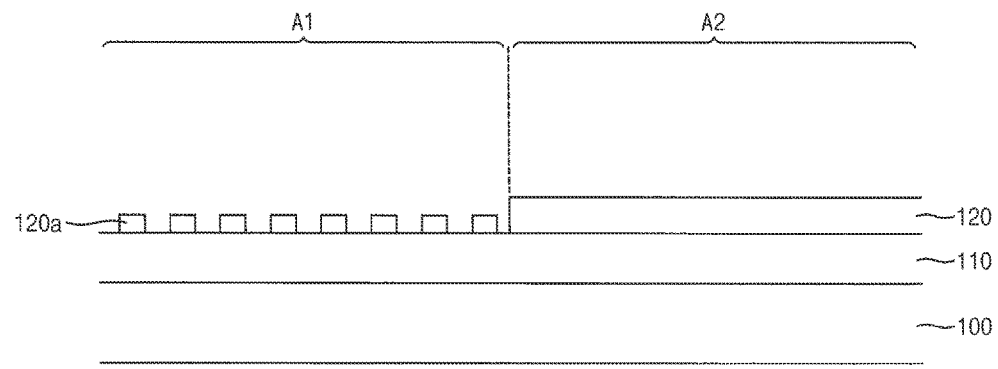

Referring to FIG. 1H, remaining layers on the mask layer 120 may be removed. The first imprint pattern 200 on the mask layer 120 and the mask pattern 120a, remaining first planarization pattern 140a, and remaining first etch protection layer 130 may be removed. Accordingly, the mask pattern 120a in the first area A1 may be exposed, and the mask layer 120 in the second area A2 may be exposed. The mask pattern 120a in the first area A1 may have thickness less than that of the mask layer 120 in the second area A2 by the process illustrated in FIG. 1C.

Figure 1I:
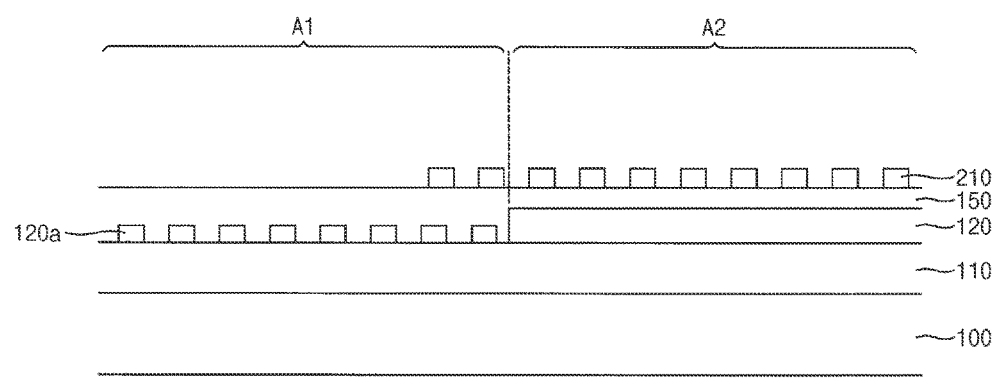

Referring to FIG. 1I, a second planarization layer 150 may be disposed on the mask pattern 120a and the mask layer 120 in the first area A1 and the second area A2, respectively. The second planarization layer 150 may be formed on the mask pattern 120a and the mask layer 120 configured to planarize a stepped portion formed by the mask layer 120 and the mask pattern 120a.

The second planarization layer 150 may include an organic material. For example, the second planarization layer 150 may include photoresist, acrylic resin, polyimide resin, polyamide resin, siloxane-based resin, and etc. These materials may be used alone or in a mixture thereof.

An additional process to improve flatness of an upper surface of the second planarization layer 150 may be performed. For example, an etch back process or chemical mechanical polishing process to the entire upper surface of the second planarization layer 150 may be performed.

Then, a second imprint pattern 210 may be disposed on the second planarization layer 150.

The second imprint pattern 210 may be formed in the second area A2. In addition, the second imprint pattern 210 may be formed in the second area A2 and in a portion of the first area A1 near the second area A2 as shown in FIG. 1I.

The second imprint pattern 210 may have a shape corresponding to a wire grid pattern of a wire grid polarizer, that the shape may be a plurality of same shaped protrusions spaced apart from each other by a uniform interval on the second planarization layer 150. The second imprint pattern 210 may have substantially the same shape as that of the first imprint pattern 200.

The second imprint pattern 210 may be formed by an imprint process similar to the imprint process of the first imprint pattern 200.

For example, a resin solution may be disposed as a form of droplet on the second planarization layer 150 by an ink jet method. The resin solution may be an ultraviolet ray curable resin composition having a relatively low viscosity.

Then, as the imprint mold is getting close to the base substrate 100, the resin solution may form a second preliminary pattern (not shown) by the imprint mold. The imprint mold may have a mirrored pattern to the second preliminary pattern. The second preliminary pattern may include a residual layer formed on the second planarization layer 150 and protrusions formed on the residual layer.

Then, ultraviolet rays may be radiated to the second preliminary pattern, so that resin solution of the second preliminary pattern may be hardened. The imprint mold may pass the ultraviolet rays, so that the ultraviolet rays may reach the second preliminary pattern through the imprint mold. Thus, the resin solution of the first preliminary pattern may be hardened.

Then, the second preliminary pattern may be overall etched to remove the residual layer between the protrusions, so that the second imprint pattern 210 may be formed.

Figure 1J:
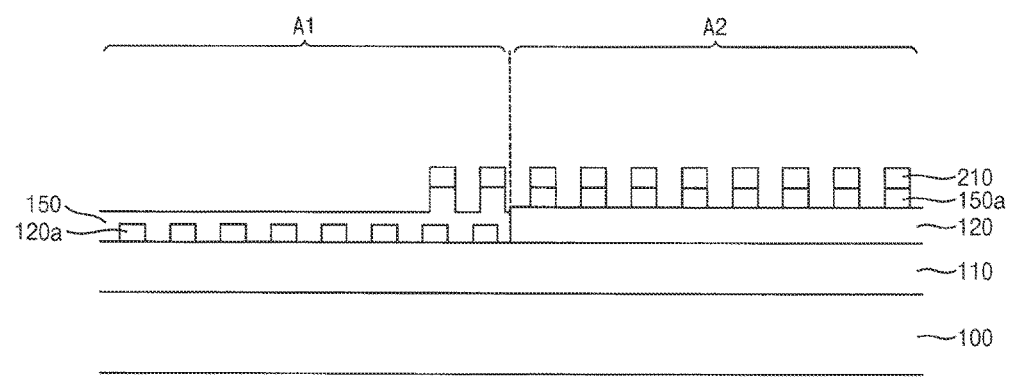

Referring to FIG. 1J, the second planarization layer 150 may be partially removed by using the second imprint pattern 210 as a mask. Accordingly, a second planarization layer pattern 150a may be formed in the second area A2. Further, the second planarization layer pattern 150a may be formed in the portion of the first area A1 near the second area A2 as shown in FIG. 1J.

For example, the second planarization layer 150 may be dry etched by using the second imprint pattern 210 as an etch barrier. Accordingly, the mask layer 120 in the second area A2 may be exposed. Here, the first thickness t1 of the mask pattern 120 in the second area A2 is greater than the second thickness t2 of the mask pattern 120a in the first area A1. Thus, although the mask layer 120 in the second area A2 is exposed, the mask pattern 120a in the first area A1 may be still covered by the second planarization layer 150.

Figure 1K:
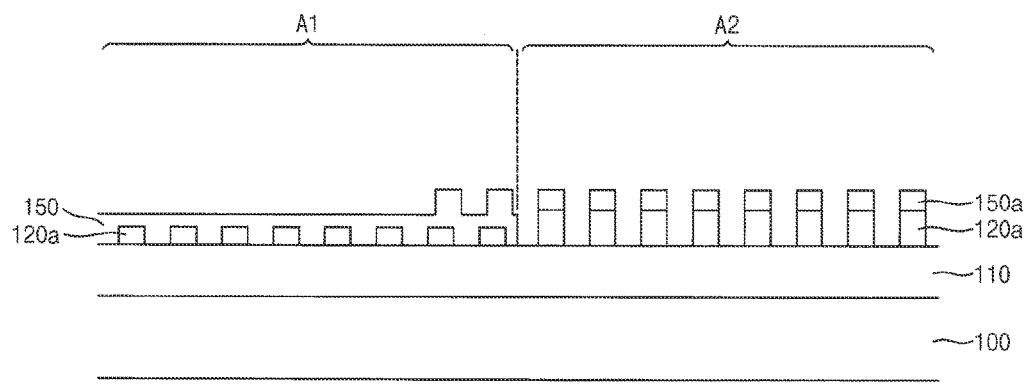

Referring to FIG. 1K, the mask layer 120 in the second area A2 may be partially removed by using the remaining portion of the second imprint pattern 210, the second planarization layer pattern 150a and remaining second planarization layer 150 as a mask. Accordingly, a mask pattern 120a may be formed in the second area A2.

For example, the mask layer 120 in the second area A2 may be dry etched by using the remaining portion of the second imprint pattern 210, the second planarization layer pattern 150a and the remaining second planarization layer 150 as an etch barrier. Accordingly, the first layer 110 in the second area A2 may be exposed.

The mask layer 120 may have an etch selectivity with respect to the second planarization layer 150 in an etching condition of the mask layer 120.

Here, the second planarization layer 150 covers the first area A1, so that in the first area A1, the mask pattern 120a may remain unetched.

Difference d of the first thickness t1 and the second thickness t2 may be determined by the etch selectivity of the mask layer 120 with respect to the second planarization layer 140. For example, in an etching condition of the mask layer 120, while the first thickness t1 of the mask layer 120 in the second area A2, the first and second thicknesses t1 and t2 may be determined not to expose the mask pattern 120a although the second planarization layer 150 in the first area A1 is consumed.

While the mask pattern 120a is disposed in the second area A2, the mask pattern 120a in the first area A1 may remain unetched. The first imprint pattern 200 and the second imprint pattern 210 may be formed overlapping with each other at a boundary of the first area A1 and the second area A2. Accordingly, an error range in the pitch of the mask pattern 120a at the boundary may be less than ½ pitch.

Figure 1L:
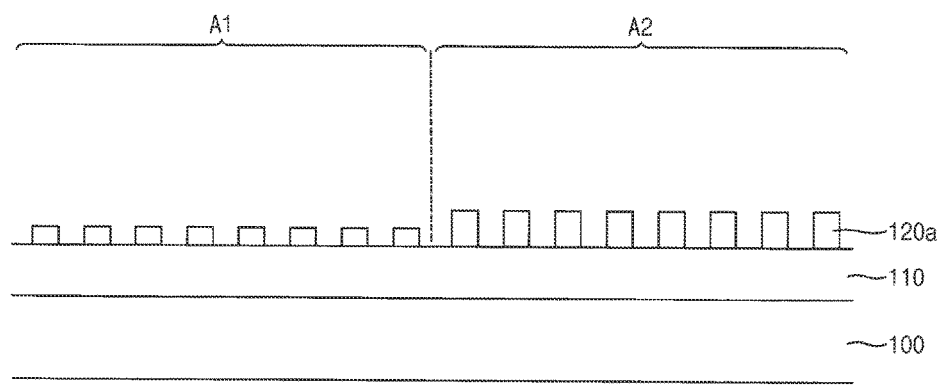

Referring to FIG. 1L, the remaining second planarization layer 150 on the mask pattern 120a and the first layer 110, the second planarization pattern 150a, and the second imprint pattern 210 may be removed. Accordingly, the first layer 110 may be exposed by the mask pattern 120a.

Figure 1M:
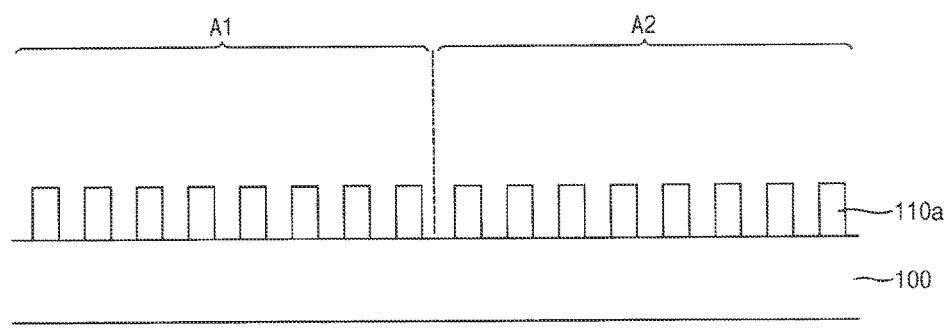

Referring to FIG. 1M, the first layer 110 may be removed by using the mask pattern 120a as a mask. Accordingly, a first layer pattern 110a may be formed in the first area A1 and the second area A2. For example, the first layer 110 may be dry etched by using the mask pattern 120a as an etch barrier.

Accordingly, a master template for an imprint lithography method, which includes the first layer pattern 110a on the base substrate 100 may be formed. The master template may perform a large area imprint process which is larger than the imprint mold. For example, the master template may be used to form an in-cell wire grid polarizer for display panel.

Although the imprint mold usually has a size smaller than a traditional wafer (300 mm diagonal length), the master template may have a size several times greater than the imprint mold, so that an imprint process for a large area may be performed. Thus, the base substrate 100 of the master template may have a diagonal length greater than 300 mm.

In addition, an error in the pattern at the boundary between the first area A1 and the second area A2 may be less than ½ pitch, so that a seam between the first area and the second area may not be visible to users when the wire grid polarizer manufactured using the master template is applied to a display apparatus.

In addition, an in-cell wire grid polarizer of a display apparatus may be formed using the method.

2A, FIG. 2B, FIG. 2C, FIG. 2D, FIG. 2E, FIG. 2F, FIG. 2G, FIG. and 2H are cross-sectional views illustrating an imprint lithography method according to an exemplary embodiment.

Figure 2A:
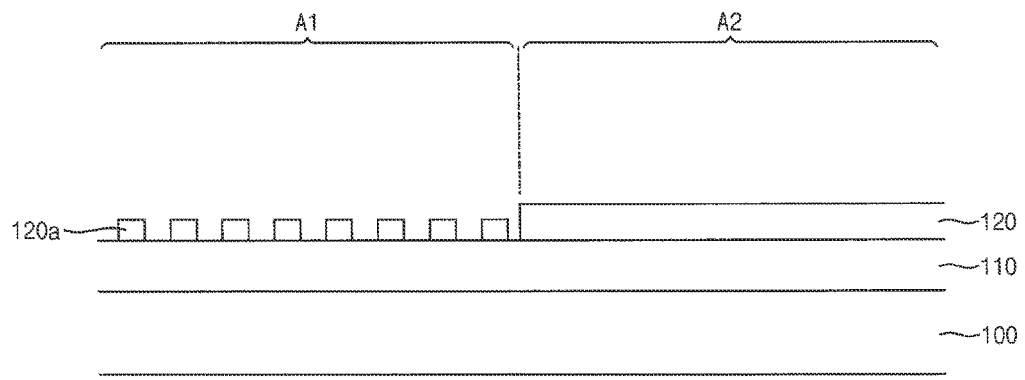
FIG. 2A, FIG. 2B, FIG. 2C, FIG. 2D, FIG. 2E, FIG. 2F, FIG. 2G, FIG. and 2H are cross-sectional views illustrating an imprint lithography method according to an exemplary embodiment.

Referring to FIG. 2A, a first layer 110 may be disposed on a base substrate 100. A mask pattern 120a may be disposed on the first layer 110 in a first area A1 and a mask layer 120 may be disposed on the first layer 110 in a second area A2.

The base substrate 100, the first layer 110, the mask pattern 120a, and the mask layer 120 may be formed by a same imprint lithography method of FIG. 1A through FIG. 1H. Thus, any further detailed descriptions concerning the same elements will be omitted.

Figure 2B:
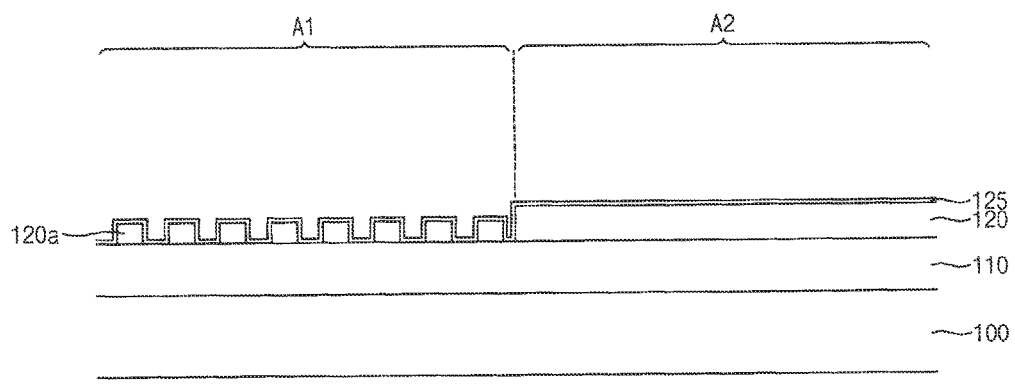

Referring to FIG. 2B, a second etch protection layer 125 may be disposed on the mask pattern 120a and the mask layer 120. The second etch protection layer 125 may prevent an unwanted etching during the following etching process.

The second etch protection layer 125 may have an etch selectivity with respect to the mask layer 120. Thus, the second etch protection layer 125 may include a material having a low etch rate than the etch rate of the mask layer 120 in an etching condition of the mask layer 120. For example, the second etch protection layer 125 may include silicon oxide ($SiO_x$), aluminum oxide ($AlO_x$), titanium oxide ($TiO_x$), titanium nitride ($TiN_x$) and aluminum nitride ($AlN_x$), etc. These materials may be used alone or in a mixture thereof.

Figure 2C:
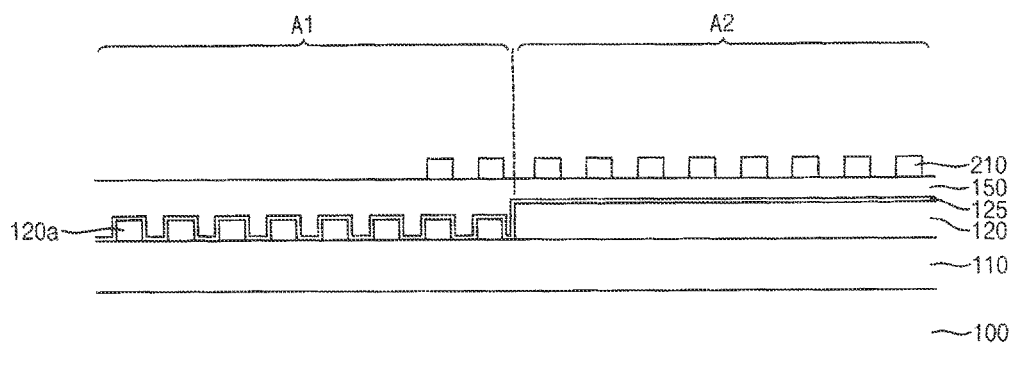

Referring to FIG. 2C, a second planarization layer 150 may be disposed on the second etch protection layer 125 in the first area A1 and the second area A2. The second planarization layer 150 may be disposed on the second etch stop layer 125 configured to planarize a stepped portion formed by the mask layer 120 and the mask pattern 120a.

The second planarization layer 150 may include an organic material. For example, the second planarization layer 150 may include photoresist, acrylic resin, polyimide resin, polyamide resin, siloxane-based resin, and etc. These materials may be used alone or in a mixture thereof.

An additional process to improve flatness of an upper surface of the second planarization layer 150 may be performed. For example, an etch back process or chemical mechanical polishing process to the entire upper surface of the second planarization layer 150 may be performed.

Then, a second imprint pattern 210 may be disposed on the second planarization layer 150.

The second imprint pattern 210 may be disposed in the second area A2. In addition, the second imprint pattern 210 may be disposed in the second area A2 and in a portion of the first area A1 near the second area A2 as shown in FIG. 2C.

The second imprint pattern 210 may have a shape corresponding to a wire grid pattern of a wire grid polarizer, such that the shape may be a plurality of protrusions having the same shape and spaced apart from each other by a uniform interval on the second planarization layer 150. The second imprint pattern 210 may be substantially the same as the first imprint pattern 200.

The second imprint pattern 210 may be formed by an imprint process similar to the imprint process of the first imprint pattern 200.

For example, a resin solution may be may be disposed in the form of droplets on the second planarization layer 150 by an ink jet method. The resin solution may be an ultraviolet ray curable resin composition having a relatively low viscosity.

Then, as the imprint mold is getting close to the base substrate 100, the resin solution may form a second preliminary pattern (not shown) by the imprint mold. The imprint mold may have a mirrored pattern to the second preliminary pattern. The second preliminary pattern may include a residual layer formed on the second planarization layer 150 and protrusions formed on the residual layer.

Then, a ultraviolet ray may be radiated to the second preliminary pattern, so that resin solution of the second preliminary pattern may be hardened. The imprint mold may pass the ultraviolet ray, so that the ultraviolet ray may reach the second preliminary pattern through the imprint mold. Thus, the resin solution of the first preliminary pattern may be hardened.

Then, the second preliminary pattern may be overall etched to remove the residual layer between the protrusions, so that the second imprint pattern 210 may be formed.

Figure 2D:
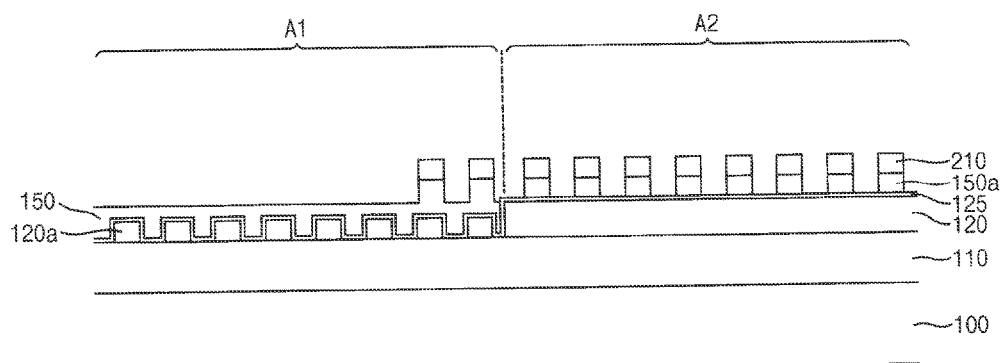

Referring to FIG. 2D, the second planarization layer 150 may be partially removed by using the second imprint pattern 210 as a mask. Accordingly, a second planarization layer pattern 150a may be formed in the second area A2. The second planarization layer pattern 150a may be formed in the portion of the first area A1 near the second area A2 as shown in FIG. 2D.

For example, the second planarization layer 150 may be dry etched by using the second imprint pattern 210 as an etch barrier. Accordingly, the second etch protection layer 125 in the second area A2 may be exposed. Here, the first thickness t1 of the mask layer 120 in the second area A2 is greater than the second thickness t2 of the mask pattern 120a in the first area A1. Thus, although the second etch protection layer 125 in the second area A2 is exposed, the mask pattern 120a in the first area A1 may be still covered by the second planarization layer 150.

Figure 2E:
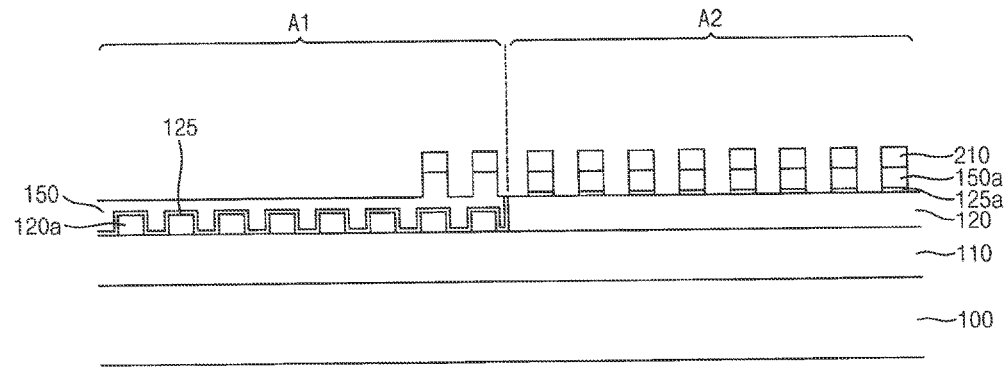

Referring to FIG. 2E, a portion of the second etch protection layer 125 in the second area A2, which is exposed, may be removed. Accordingly, the mask layer 120 in the second area A2 may be exposed. Here, the second etch protection layer 125 in the first area A1 is covered by the second planarization layer 150, so that the second etch protection layer 125 may remain unetched in the first area A1.

Figure 2F:
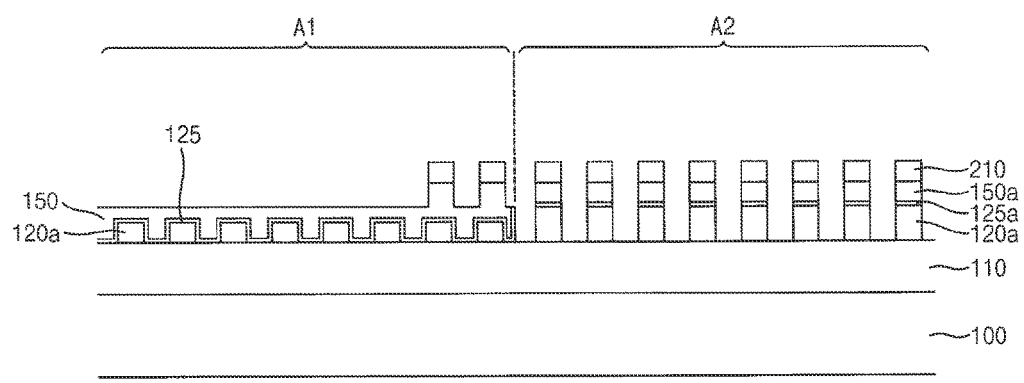

Referring to FIG. 2F, the mask layer 120 may be partially removed by using the remaining second imprint pattern 210, the second planarization layer pattern 150a, the remaining second planarization layer 150, and the second etch protection layer 125 in the first area A1 as a mask. Accordingly, a mask pattern 120a may be formed in the second area A2.

For example, the mask layer 120 may be dry etched by using the remaining second imprint pattern 210, the second planarization layer pattern 150a, remaining second planarization layer 150, and the second etch protection layer 125 in the first area A1 as an etch barrier. Accordingly, the first layer 110 in the second area A2 may be exposed.

Here, the second protection stop layer 125 in the first area A1 covers the mask pattern 120a, so that the mask pattern 120a in the first area A1 may remain unetched.

Figure 2G:
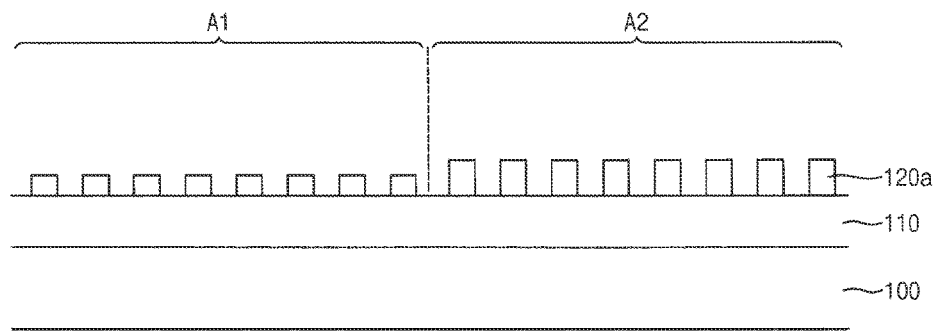

Referring to FIG. 2G, the remaining second planarization layer 150 on the mask pattern 120a and the first layer 110, the second planarization pattern 150a, the second imprint pattern 210, and the second etch protection layer 125 may be removed. Accordingly, the first layer 110 may be exposed by the mask pattern 120a.

Figure 2H:
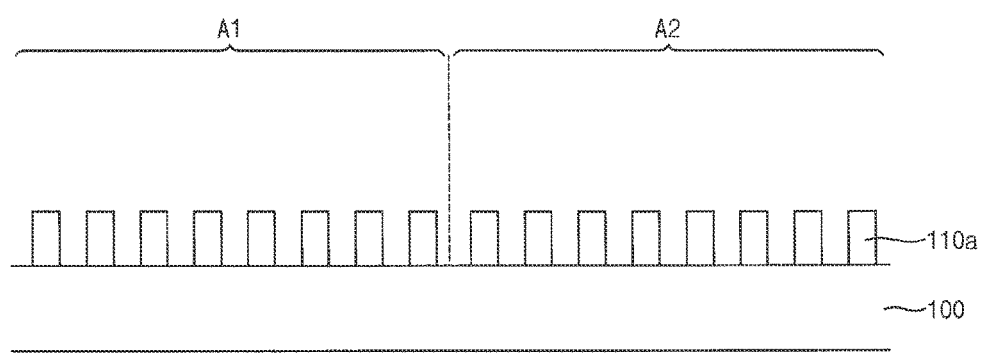

Referring to FIG. 2H, the first layer 110 may be removed by using the mask pattern 120a as a mask. Accordingly, a first layer pattern 110a may be formed in the first area A1 and the second area A2. For example, the first layer 110 may be dry etched by using the mask pattern 120a as an etch barrier.

Accordingly, a master template for an imprint lithography method which includes the first layer pattern on the base substrate may be formed. The master template may perform a large area imprint process which is larger than the imprint mold. For example, the master template may be used to form an in-cell wire grid polarizer for a display panel.

Although the imprint mold usually has a diagonal length less than a traditional wafer (300 mm), according to an exemplary embodiment, the master template may have a diagonal length several times greater than the imprint mold, so that the large area imprint process may be performed. Thus, a diagonal length of the base substrate of the master template may be greater than 300 mm.

In addition, an error of the pattern at the boundary between the first area and the second area may be less than ½ pitch, so that a seam between the first area and the second area may not be visible to users when the wire grid polarizer manufactured using the master template is applied to a display apparatus.

In addition, an in-cell wire grid polarizer of a display apparatus may be formed using the method.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An imprint lithography method comprising:
disposing a mask layer on a base substrate in a first area and in a second area, the second area being adjacent to the first area;
reducing a thickness of the mask layer in the first area;
disposing a first planarization layer on the mask layer in the first and second areas;
forming a first imprint pattern on the first planarization layer;
forming a first planarization layer pattern by etching the first planarization layer using the first imprint pattern as an etch barrier;
forming a first mask pattern in the first area by etching the mask layer using the first planarization layer pattern as an etch barrier;
disposing a second planarization layer on the first mask pattern and the mask layer in the first and second areas;
forming a second imprint pattern on the second planarization layer;
forming a second planarization layer pattern by etching the second planarization layer using the second imprint pattern as an etch barrier; and
forming a second mask pattern in the second area by etching the mask layer using the second planarization layer pattern as an etch barrier,
wherein the mask layer has a first thickness in the second area, and has a second thickness in the first area, the first thickness being greater than the second thickness.

2. The method of claim 1, wherein reducing the thickness of the mask layer comprises:
forming a first etch protection layer on the mask layer in the second area; and
etching the mask layer using the first etch protection layer.

3. The method of claim 2, wherein the first etch protection layer has an etch selectivity with respect to the mask layer.

4. The method of claim 3, wherein:
the first etch protection layer comprises silicon compound;
the mask layer comprises metal; and
the first and second planarization layers each comprise organic material.

5. The method of claim 2, wherein
the first and second thicknesses are associated with an etch selectivity of the mask layer to the first planarization layer.

6. The method of claim 5, wherein a thickness of an etched portion of the first planarization layer, while the mask layer having the first thickness is etched in an etching condition of the mask layer, is less than a difference between the first thickness and the second thickness.

7. The method of claim 1, further comprising:
before forming the first imprint pattern, performing an etch back process or chemical mechanical polishing process to the first planarization layer to improve flatness of an upper surface of the first planarization layer.

8. The method of claim 1, wherein forming the first imprint pattern comprises:
providing a resin solution on the first planarization layer;
forming a preliminary pattern from the resin solution using an imprint mold; and
hardening the preliminary pattern.

9. The method of claim 1, wherein:
in forming the first imprint pattern, the first imprint pattern is formed in the first area and in a portion of the second area; and
the portion of the second area is closer to the first area than the remaining portion of the second area.

10. The method of claim 9, wherein:
in forming the second imprint pattern, the second imprint pattern is in the second area and in a portion of the first area; and
the portion of the first area is closer to the second area than the remaining portion of first area.

11. The method of claim 1, wherein the first imprint pattern and the second imprint pattern have a shape corresponding to a wire grid pattern.

12. The method of claim 1, further comprising:
between forming the first mask pattern and forming the second planarization layer, removing the first imprint pattern, the first planarization layer pattern, and the first etch protection layer.

13. The method of claim 1 further comprising:
forming a first layer on the base substrate before forming the mask layer; and
forming a first layer pattern by etching the first layer using the mask pattern in the first and second areas as an etch barrier after forming the second mask pattern in the second area.

14. The method of claim 1, wherein in forming the second planarization layer pattern, the second planarization layer is etched until the mask layer in the second area is exposed.

15. The method of claim 2 further comprising:
disposing a second etch protection layer on the first mask pattern in the first area and on the mask layer in the second area before forming the second planarization layer.

16. The method of claim 15, wherein in forming the second planarization layer pattern, the second planarization layer is etched until the second etch protection layer in the second area is exposed.

17. The method of claim 16, wherein the second etch protection layer comprises at least one selected form the group consisting of silicon oxide (SiOx), aluminum oxide (AlOx), titanium oxide (TiOx), titanium nitride (TiNx) and aluminum nitride (AlNx).

18. A method of manufacturing a master template for imprint lithography comprising:
disposing a mask layer on a base substrate in a first area and in a second area, the second area being adjacent to the first area;
reducing a thickness of the mask layer in the first area;
forming a first imprint pattern on the mask layer in the first area and in a portion of the second area, the portion of the second area being closer to the first area than the remaining portion of the second area;
forming a first mask pattern in the first area by etching the mask layer using the first imprint pattern as an etch barrier;
forming a second imprint pattern on the mask layer in the second area and in a portion of the first area, the portion of the first area being closer to the second area than the remaining portion of the first area;
forming a second mask pattern in the second area by etching the mask layer using the second imprint pattern as an etch barrier; and
etching an object under the first and second mask patterns using the first and second mask patterns as etch barriers,
wherein the mask layer has a first thickness in the second area, and has a second thickness in the first area, the first thickness being greater than the second thickness.

19. The method of claim 18, wherein reducing the thickness of the mask layer comprises:
disposing a first etch protection layer on the mask layer in the second area; and
etching the mask layer using the first etch protection layer.

* * * * *